US009698208B1

(12) United States Patent
Li et al.

(10) Patent No.: US 9,698,208 B1
(45) Date of Patent: Jul. 4, 2017

(54) ARRAY SUBSTRATE, DISPLAY PANEL AND DISPLAY APPARATUS HAVING THE SAME, AND FABRICATING METHOD THEREOF

(71) Applicant: BOE TECHNOLOGY GROUP CO., LTD., Beijing (CN)

(72) Inventors: Guang Li, Beijing (CN); Chen Xu, Beijing (CN)

(73) Assignee: BOE TECHNOLOGY GROUP CO., LTD., Chaoyang District, Beijing (CN)

( * ) Notice: Subject to any disclaimer, the term of this patent is extended or adjusted under 35 U.S.C. 154(b) by 0 days.

(21) Appl. No.: 15/302,934

(22) PCT Filed: Apr. 6, 2016

(86) PCT No.: PCT/CN2016/078556
§ 371 (c)(1),
(2) Date: Oct. 7, 2016

(87) PCT Pub. No.: WO2017/031990
PCT Pub. Date: Mar. 2, 2017

(30) Foreign Application Priority Data

Aug. 26, 2015 (CN) .......................... 2015 1 0531471

(51) Int. Cl.
*H01L 27/14* (2006.01)
*H01L 27/32* (2006.01)
(Continued)

(52) U.S. Cl.
CPC ....... *H01L 27/3262* (2013.01); *G09G 3/3208* (2013.01); *H01L 27/3276* (2013.01);
(Continued)

(58) Field of Classification Search
CPC ...... G09G 3/32; G09G 3/3208; G09G 3/3225; G09G 3/3233; G09G 3/3648; G09G 3/3651; H01L 21/77; H01L 27/3276
(Continued)

(56) References Cited

U.S. PATENT DOCUMENTS

| 8,461,660 B2 | 6/2013 | Manabe |
| 9,318,047 B2 * | 4/2016 | Hsu ...................... G09G 3/3233 |
| 2007/0001937 A1 * | 1/2007 | Park ...................... G09G 3/3233 345/76 |

FOREIGN PATENT DOCUMENTS

| CN | 204257651 U | 4/2015 |
| KR | 20010061100 A | 7/2001 |

OTHER PUBLICATIONS

International Search Report & Written Opinion mailed Jul. 11 2016 regarding PCT/CN2016/078556.

* cited by examiner

*Primary Examiner* — Trung Q Dang
(74) *Attorney, Agent, or Firm* — Intellectual Valley Law, P.C.

(57) ABSTRACT

The present application discloses an array substrate comprising a base substrate; and a plurality of rows of pixel units and a plurality of rows of reset signal lines on the base substrate, every two adjacent rows of pixel units share one reset signal line. Every two adjacent rows of pixel units and a reset signal line between the two adjacent rows of pixel units constitute a pixel unit group, each pixel unit group comprises a plurality of columns of pixel units. Each pixel unit comprises a reset thin film transistor, each reset thin film transistor comprises a conductive semiconductor layer on the base substrate, a first insulating layer on a side of the conductive semiconductor layer distal to the base substrate, a gate electrode on a side of the first insulating layer distal to the conductive semiconductor layer, a second insulating layer on a side of the gate electrode distal to the first insulating layer, a source/drain/metal electrode layer on a side of the second insulating layer distal to the gate electrode, and a source via, a drain via, and a metal electrode via; the conductive semiconductor layer comprises a first semi- (Continued)

conductor electrode and a second semiconductor electrode, and the source/drain/metal electrode layer comprises a source electrode, a drain electrode, and a metal electrode. The metal electrode via is at a position corresponding to an area where the reset signal line and the second semiconductor electrode overlap in plan view of the substrate, the metal electrode via exposing part of the reset signal line and part of the second semiconductor electrode. The metal electrode within the metal electrode via is electrically connected to the reset signal line and the second semiconductor electrode, the second semiconductor electrode is electrically connected to two drain electrodes of the reset thin film transistor in two neighboring pixel units in a same column within a same pixel unit group through two corresponding drain vias. The source electrode is electrically connected to the first semiconductor electrode through the source via.

20 Claims, 4 Drawing Sheets

(51) Int. Cl.
  *G09G 3/3208* (2016.01)
  *H01L 27/12* (2006.01)
(52) U.S. Cl.
  CPC . *G09G 2300/043* (2013.01); *G09G 2310/061* (2013.01); *H01L 27/124* (2013.01); *H01L 2227/323* (2013.01)
(58) Field of Classification Search
  USPC .......................................................... 257/72
  See application file for complete search history.

US 9,698,208 B1

ARRAY SUBSTRATE, DISPLAY PANEL AND DISPLAY APPARATUS HAVING THE SAME, AND FABRICATING METHOD THEREOF

CROSS-REFERENCE TO RELATED APPLICATION

This application is a national stage application under 35 U.S.C. §371 of International Application No. PCT/CN2016/078556, filed Apr. 6, 2016, which claims priority to Chinese Patent Application No. 201510531471.X, filed Aug. 26, 2015, the contents of which are incorporated by reference in the entirety.

TECHNICAL FIELD

The present invention relates to display technology, more particularly, to an array substrate, a display panel and a display apparatus having the same, and a fabricating method thereof.

BACKGROUND

As compared to other display devices such as liquid crystal display (LCD) devices, the organic light emitting diode (OLED) display devices are self-emitting apparatuses that do not require a backlight. Having the advantages of fast response, low power consumption, a wider viewing angle, high brightness, more vivid color rendering, thinner and lighter, they have found a wide range of applications in display field.

Light emission in an OLED device are driven by current. To achieve a display with uniform brightness, a stable current at each pixel unit is essential. Various factors, such as a defective manufacturing process and aging components, could result in shift of threshold voltage of driving thin film transistor in an array substrate from the standard value. The shift of threshold voltage in turn results in variation of the current applied to each pixel, leading to non-uniform display of OLED.

SUMMARY

In one aspect, the present invention provides an array substrate comprising a base substrate; and a plurality of rows of pixel units and a plurality of rows of reset signal lines on the base substrate, every two adjacent rows of pixel units share one reset signal line. Every two adjacent rows of pixel units and a reset signal line between the two adjacent rows of pixel units constitute a pixel unit group, each pixel unit group comprises a plurality of columns of pixel units. Each pixel unit comprises a reset thin film transistor, each reset thin film transistor comprises a conductive semiconductor layer on the base substrate, a first insulating layer on a side of the conductive semiconductor layer distal to the base substrate, a gate electrode on a side of the first insulating layer distal to the conductive semiconductor layer, a second insulating layer on a side of the gate electrode distal to the first insulating layer, a source/drain/metal electrode layer on a side of the second insulating layer distal to the gate electrode, and a source via, a drain via, and a metal electrode via; the conductive semiconductor layer comprises a first semiconductor electrode and a second semiconductor electrode, and the source/drain/metal electrode layer comprises a source electrode, a drain electrode, and a metal electrode. The metal electrode via is at a position corresponding to an area where the reset signal line and the second semiconductor electrode overlap in plan view of the substrate, the metal electrode via exposing part of the reset signal line and part of the second semiconductor electrode. The metal electrode within the metal electrode via is electrically connected to the reset signal line and the second semiconductor electrode, the second semiconductor electrode is electrically connected to two drain electrodes of the reset thin film transistor in two neighboring pixel units in a same column within a same pixel unit group through two corresponding drain vias. The source electrode is electrically connected to the first semiconductor electrode through the source via.

Optionally, two adjacent pixels in a same column of a same pixel unit group share a same metal electrode through a same metal electrode via, and share a same second semiconductor electrode; the second semiconductor electrode is a continuous layer connecting two reset thin film transistors in a same column of a same pixel unit group.

Optionally, the metal electrode via is a step via, at least a portion of which having a trapezoidal shape.

Optionally, a projection of the metal electrode via in plan view of the base substrate is within a projection of the reset signal line.

Optionally, the array substrate further comprises two reset scanning lines between the two adjacent rows of pixel units within the same pixel unit group; the reset signal line is between the two reset scanning lines.

Optionally, the array substrate further comprises two gate lines between the two adjacent rows of pixel units within the same pixel unit group; the two reset scanning lines are between the two gate lines.

Optionally, the two reset scanning lines and the two gate lines are in a same layer as the gate electrode.

Optionally, the array substrate further comprises a plurality of data lines and a plurality of power signal lines; each date line and each power signal line are between two adjacent columns of pixel units.

Optionally, each pixel unit further comprises a light emitting unit, a second thin film transistor, a third thin film transistor, and a capacitor.

Optionally, the gate electrode is electrically connected to an adjacent reset scanning line; the source electrode of the reset thin film transistor is electrically connected to a source electrode of the second thin film transistor, a gate electrode of the third thin film transistor is electrically connected to a first terminal of the capacitor, the gate electrode of the second thin film transistor is electrically connected to an adjacent gate line, a drain electrode of a second thin film transistor is electrically connected to a data line, a drain electrode of a third thin film transistor and a second terminal of the capacitor are electrically connected to a power signal line, and a source electrode of the third thin film transistor is electrically connected to the light emitting unit.

In another aspect, the present invention provides a method of fabricating an array substrate comprising forming a plurality of rows of pixel units and a plurality of rows of reset signal lines on a base substrate, every two adjacent rows of pixel units share one reset signal line. Every two adjacent rows of pixel units and a reset signal line between the two adjacent rows of pixel units constitute a pixel unit group, each pixel unit group comprises a plurality of columns of pixel units. The step of forming the plurality of rows of pixel units and the plurality of rows of reset signal lines comprises forming a rest thin film transistor within each pixel unit.

Optionally, the step of forming the reset thin film transistor comprises forming a conductive semiconductor layer having a first semiconductor electrode and a second semiconductor electrode on the base substrate; forming a first gate insulating layer on a side of the conductive semiconductor layer distal to the base substrate; forming a gate metal layer having a reset signal line and a gate electrode of a first thin film transistor on a side of the first gate insulating layer distal to the conductive semiconductor layer; forming a second gate insulating layer on a side of the gate metal layer distal to the first gate insulating layer; forming a source via, a drain via, and a metal electrode via in a single patterning process; and forming a source/drain metal layer having a metal electrode, and a source electrode and a drain electrode of the first thin film transistor on a side of the second gate insulating layer distal to the gate metal layer.

Optionally, the metal electrode via is at a position corresponding to an area where the reset signal line and the second semiconductor electrode overlap in plan view of the base substrate, the metal electrode via exposing part of the reset signal line and part of the second semiconductor electrode. The metal electrode within the metal electrode via is electrically connected to the reset signal line and the second semiconductor electrode, the second semiconductor electrode is electrically connected to two drain electrodes of the reset thin film transistor in two neighboring pixel units in a same column within a same pixel unit group through two corresponding drain vias. The source electrode is electrically connected to the first semiconductor electrode through the source via.

Optionally, two adjacent pixels in a same column of a same pixel unit group share a same metal electrode through a same metal electrode via, and share a same second semiconductor electrode; the second semiconductor electrode is a continuous layer connecting two reset thin film transistors in a same column of a same pixel unit group.

Optionally, the metal electrode via is a step via, at least a portion of which having a trapezoidal shape.

Optionally, a projection of the metal electrode via in plan view of the base substrate is within a projection of the reset signal line.

Optionally, the method further comprises forming two reset scanning lines between the two adjacent rows of pixel units within the same pixel unit group; wherein the reset signal line is formed between the two reset scanning lines.

Optionally, the method further comprises forming two gate lines between the two adjacent rows of pixel units within the same pixel unit group; wherein the two reset scanning lines are formed between the two gate lines.

Optionally, the two reset scanning lines and the two gate lines are formed in a single process and in a same layer as the gate electrode.

Optionally, the method further comprises forming a plurality of data lines and a plurality of power signal lines; each date line and each power signal line are formed between two adjacent columns of pixel units.

Optionally, the method further comprises forming a light emitting unit, a second thin film transistor, a third thin film transistor, and a capacitor in each pixel unit.

Optionally, the gate electrode is electrically connected to an adjacent reset scanning line; the source electrode of the reset thin film transistor is electrically connected to a source electrode of the second thin film transistor, a gate electrode of the third thin film transistor is electrically connected to a first terminal of the capacitor, the gate electrode of the second thin film transistor is electrically connected to an adjacent gate line, a drain electrode of a second thin film transistor is electrically connected to a data line, a drain electrode of a third thin film transistor and a second terminal of the capacitor are electrically connected to a power signal line, and a source electrode of the third thin film transistor is electrically connected to the light emitting unit.

In another aspect, the present invention also provides a display panel comprising the array substrate described herein or manufactured by a method described herein.

In another aspect, the present invention further provides a display apparatus comprising the display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
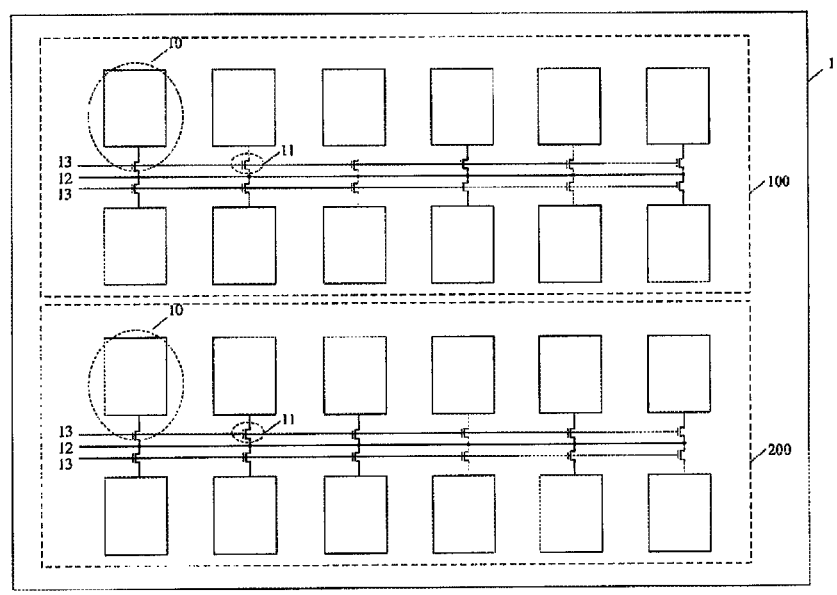
FIG. 1 is a diagram illustrating the arrangement of pixel units in an array substrate in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In some cases, an OLED device includes a reset unit to compensate the shift of the threshold voltage of the driving transistor. The reset unit includes a rest thin film transistor and a reset signal line. The addition of the reset unit decreases the aperture ratio of the array substrate, making high-resolution display in an OLED device even more difficult.

The present disclosure provides an array substrate having superior properties that enables higher-resolution display in OLED, and a greatly simplified fabricating method for making the array substrate. In some embodiments, the array substrate includes a reset unit. In the present array substrate, two adjacent rest units share one single reset signal line. The reset signal line, the gate electrode, and the source/drain electrode of the rest unit can be all connected through a single via. Moreover, all vias of the present array substrate can be fabricated in a single process. The present array substrate and fabricating method overcome the disadvantages of the conventional array substrate and fabricating method. As a result, a significantly reduced aperture ratio of the array substrate can be achieved.

In some embodiments, the array substrate includes a bases substrate, a plurality of rows of pixel units, and a plurality of rows of reset signal lines on the base substrate. In the present array substrate, every two adjacent rows of pixel units share one reset signal line. Optionally, the number of rows of pixel units in the array substrate is twice that of the number of rows of reset signal lines. For example, every two adjacent rows of pixel units and a reset signal line between the two adjacent rows of pixel units constitute a pixel unit group. Optionally, the array substrate include a row of reset signal line only between two adjacent rows of pixel units within a same pixel unit group, but not between two adjacent pixel unit groups (i.e., not between two adjacent rows of pixel units that belong to different pixel unit groups). Each pixel unit group includes a plurality of columns of pixel units. Optionally, each column of pixel unit of a pixel unit group includes two pixel units.

In some embodiments, each pixel unit includes a reset thin film transistor. Optionally, each reset thin film transistor includes a conductive semiconductor layer on the base substrate, a first insulating layer on a side of the conductive semiconductor layer distal to the base substrate, a gate electrode on a side of the first insulating layer distal to the conductive semiconductor layer, a second insulating layer on a side of the gate electrode distal to the first insulating layer, a source/drain/metal electrode layer on a side of the second insulating layer distal to the gate electrode, and a source via, a drain via, and a metal electrode via. Optionally, the conductive semiconductor layer includes a first semiconductor electrode and a second semiconductor electrode, and the source/drain/metal electrode layer comprises a source electrode, a drain electrode, and a metal electrode. Optionally, the metal electrode via is at a position corresponding to an area where the reset signal line and the second semiconductor electrode overlap in plan view of the substrate, the metal electrode via exposing part of the reset signal line and part of the second semiconductor electrode. Optionally, the metal electrode within the metal electrode via is electrically connected to the reset signal line and the second semiconductor electrode, the second semiconductor electrode is electrically connected to two drain electrodes of the reset thin film transistor in two neighboring pixel units in a same column within a same pixel unit group through two corresponding drain vias. Optionally, the source electrode is electrically connected to the first semiconductor electrode through the source via.

In some embodiments, two adjacent pixels in a same column of a same pixel unit group share a same second semiconductor electrode. For example, two drain electrodes of two reset thin film transistors in a same column of a same pixel unit group (i.e., from two adjacent rows of pixel units within a same pixel unit group) are connected to a same second semiconductor electrode. Two active layers of two reset thin film transistors in a same column of a same pixel unit group (i.e., from two adjacent rows of pixel units within a same pixel unit group) are connected to a same second semiconductor electrode. That is, the two active layers of two reset thin film transistors in a same column of a same pixel unit group are connected to the two drain electrodes of two reset thin film transistors in a same column of a same pixel unit group through a same second semiconductor electrode. Thus, in some embodiments, the second semiconductor electrode is a continuous layer connecting two reset thin film transistors in a same column of a same pixel unit group (i.e., from two adjacent rows of pixel units within a same pixel unit group).

In some embodiments, two adjacent pixels in a same column of a same pixel unit group share a same metal electrode through a same metal electrode via. The same metal electrode is connected to the same second semiconductor electrode shared by two reset thin film transistors in a same column of a same pixel unit group (i.e., from two adjacent rows of pixel units within a same pixel unit group).

In another aspect, the present disclosure provides a method of fabricating an array substrate. In some embodiments, the method includes forming a plurality of rows of pixel units and a plurality of rows of reset signal lines on a base substrate. In the present method, every two adjacent rows of pixel units are so formed that they share one reset signal line. Optionally, the number of rows of pixel units formed in the array substrate is twice that of the number of rows of reset signal lines. For example, the method includes forming a plurality of pixel unit groups, each of which is constituted by every two adjacent rows of pixel units and a reset signal line formed between the two adjacent rows of pixel units. Optionally, the method includes forming one row of reset signal line only between two adjacent rows of pixel units within a same pixel unit group, but not between two adjacent pixel unit groups (i.e., not between two adjacent rows of pixel units that belong to different pixel unit groups). Each pixel unit group includes a plurality of columns of pixel units. Optionally, each column of pixel unit of a pixel unit group includes two pixel units.

In some embodiments, the step of forming the plurality of rows of pixel units and the plurality of rows of reset signal lines includes forming a rest thin film transistor within each pixel unit. Optionally, the step of forming the reset thin film transistor includes forming a conductive semiconductor layer having a first semiconductor electrode and a second semiconductor electrode on the base substrate; forming a first gate insulating layer on a side of the conductive semiconductor layer distal to the base substrate; forming a gate metal layer having a reset signal line and a gate electrode of a first thin film transistor on a side of the first gate insulating layer distal to the conductive semiconductor layer; forming a second gate insulating layer on a side of the gate metal layer distal to the first gate insulating layer; forming a source via, a drain via, and a metal electrode via in a single patterning process; and forming a source/drain metal layer having a metal electrode, and a source electrode and a drain electrode of the first thin film transistor on a side of the second gate insulating layer distal to the gate metal layer. Optionally, the metal electrode via is at a position corresponding to an area where the reset signal line and the second semiconductor electrode overlap in plan view of the base substrate. Optionally, the metal electrode via exposing part of the reset signal line and part of the second semiconductor electrode. Optionally, the metal electrode within the metal electrode via is electrically connected to the reset signal line and the second semiconductor electrode. Optionally, the second semiconductor electrode is electrically connected to two drain electrodes of the reset thin film transistor in two neighboring pixel units in a same column within a same pixel unit group through two corresponding drain vias. Optionally, the source electrode is electrically connected to the first semiconductor electrode through the source via.

In some embodiments, two adjacent pixels in a same column of a same pixel unit group share a same second semiconductor electrode. For example, two drain electrodes of two reset thin film transistors in a same column of a same pixel unit group (i.e., from two adjacent rows of pixel units within a same pixel unit group) are connected to a same second semiconductor electrode. Two active layers of two reset thin film transistors in a same column of a same pixel unit group (i.e., from two adjacent rows of pixel units within a same pixel unit group) are connected to a same second semiconductor electrode. That is, the two active layers of two reset thin film transistors in a same column of a same pixel unit group are connected to the two drain electrodes of two reset thin film transistors in a same column of a same pixel unit group through a same second semiconductor electrode. Thus, in some embodiments, the second semiconductor electrode is a continuous layer connecting two reset thin film transistors in a same column of a same pixel unit group (i.e., from two adjacent rows of pixel units within a same pixel unit group).

In some embodiments, two adjacent pixels in a same column of a same pixel unit group share a same metal electrode through a same metal electrode via. The same metal electrode is connected to the same second semiconductor electrode shared by two reset thin film transistors in a same column of a same pixel unit group (i.e., from two adjacent rows of pixel units within a same pixel unit group).

FIG. 1 is a diagram illustrating the arrangement of pixel units in an array substrate in some embodiments. Referring to FIG. 1, the array substrate includes a base substrate 1 and a plurality of pixel units on the base substrate 1. The plurality of pixel units 10 include a plurality of rows of pixel units and a plurality of columns of pixel units intersecting each other. Therefore, each pixel unit 10 is adjacent to at least one (e.g., two) neighboring pixel unit 10 in a same row, and is adjacent to at least one (e.g., two) neighboring pixel unit 10 in a same column. As shown in FIG. 1, the plurality of pixel units 10 may be grouped into a plurality of pixel unit groups. For example, FIG. 1 shows two pixel unit groups 100 and 200. Each pixel unit group includes two adjacent rows of pixel units. Each row of pixel units includes a plurality of pixel units arranged repeatedly in sequence along a first direction. Each pixel unit includes three or more sub-pixels, e.g., a first sub-pixel, a second sub-pixel, and a third sub-pixel. Each pixel unit group further includes a reset signal line 12 between the two adjacent rows of pixel units within each pixel unit group. Optionally, each pixel unit group further includes two reset scanning lines 13 between the two adjacent rows of pixel units. Each pixel unit 10 includes a first thin film transistor 11 (e.g., a reset transistor).

Figure 2:
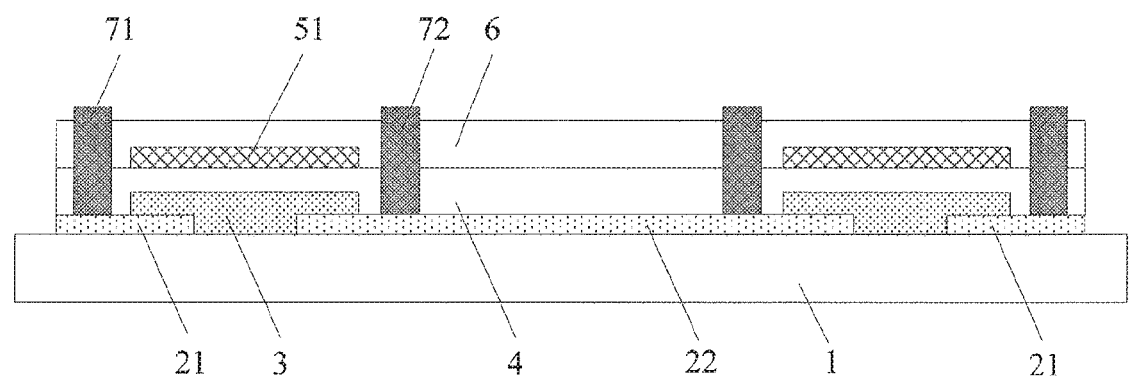
FIG. 2 is a diagram illustrating the structure of two first thin film transistors in two neighboring pixel units in a same column within a same pixel unit group in an array substrate in some embodiments.

FIG. 2 is a diagram illustrating the structure of two first thin film transistors in two neighboring pixel units in a same column within a same pixel unit group in an array substrate in some embodiments. The two neighboring pixel units in FIG. 2 belong to two neighboring rows within a same pixel unit group along a same column direction. Referring to FIG. 2, the first thin film transistor (e.g., a reset transistor) includes a conductive semiconductor layer (21 and 22 in FIG. 2) on a base substrate 1, an active layer 3 on a side of the conductive semiconductor layer distal to the base substrate 1, a first insulating layer 4 on a side of the active layer 3 distal to the conductive semiconductor layer, a gate electrode 51 on a side of the first insulating layer 4 distal to the active layer 3, a second insulating layer 6 on a side of the gate electrode 51 distal to the first insulating layer 4, and a source/drain electrode layer on a side of the second insulating layer 6 distal to the gate electrode 51.

The conductive semiconductor layer in the embodiment includes a first semiconductor electrode 21 and a second semiconductor electrode 22. The source/drain electrode layer in the embodiment includes a source electrode 71 and a drain electrode 72 of the first thin film transistor 11. The first semiconductor electrode 21 and the second semiconductor electrode 22 are electrically connected to the source electrode 71 and the drain electrode 72 of the first thin film transistor 11, respectively, through a source via and a drain via.

Figure 3:
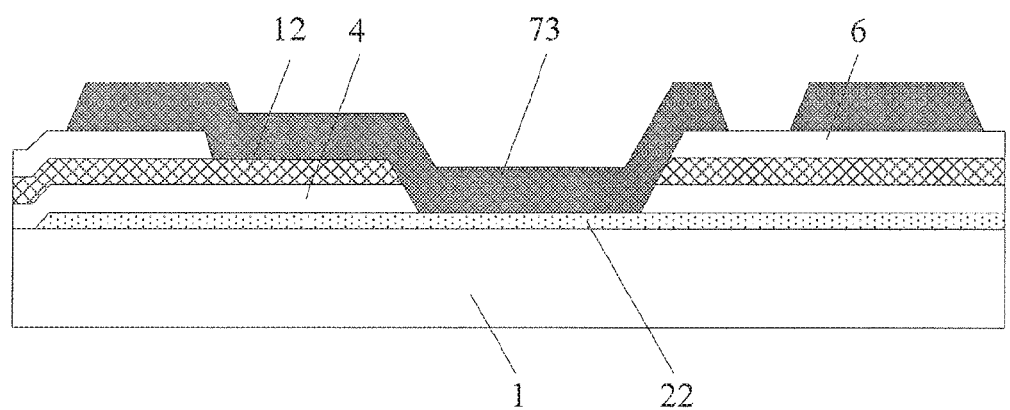
FIG. 3 is a cross-section view of the structure of a metal electrode via having a metal electrode formed therein in an array substrate in some embodiments.
Figure 4:
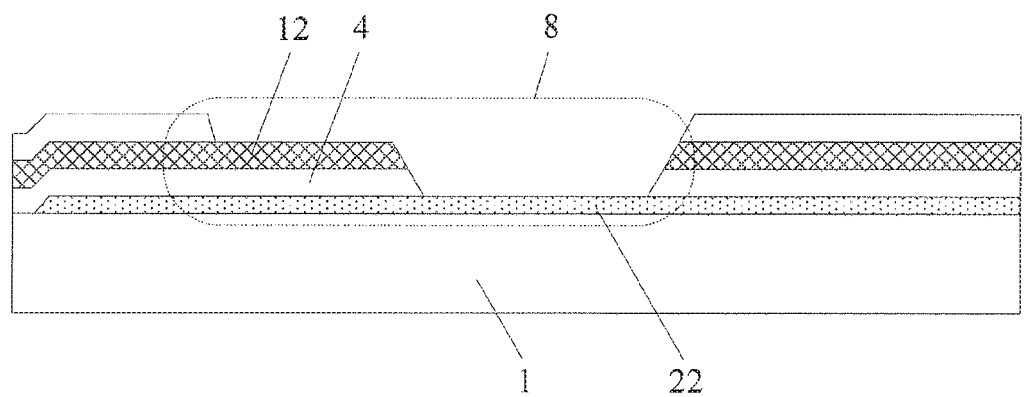
FIG. 4 is a cross-section view of the structure of a metal electrode via in an array substrate in some embodiments.

FIG. 3 is a cross-section view of the structure of a metal electrode via having a metal electrode formed therein in an array substrate in some embodiments. FIG. 4 is a cross-section view of the structure of a metal electrode via (prior to the formation of the metal electrode) in an array substrate in some embodiments. Referring to FIGS. 3 and 4, the array substrate in the embodiment further includes a metal electrode via 8 above a region where the reset signal line 12 overlaps with the second semiconductor electrode 22. The drain electrode 72 is electrically connected to the reset signal line 12 within the metal electrode via 8. In FIG. 4, the metal electrode via 8 is a step via, at least a portion of which having a trapezoidal shape. A portion of the metal electrode via 8 exposes part of the reset signal line 12, another portion of the metal electrode via 8 exposes part of the second semiconductor electrode 22. Referring to FIG. 3, the source/drain electrode layer further includes a metal electrode 73 extending throughout the metal electrode via 8. As shown in FIG. 3, the metal electrode 73 is in contact with a first portion of the metal electrode via 8 that exposes part of the reset signal line 12, and a second portion of the metal electrode via 8 that exposes part of the second semiconductor electrode 22.

The present array substrate includes a reset signal line 12 shared by two adjacent rows of pixel units that belongs to a same pixel unit group. The reset signal line 12 is connected to the first thin film transistor 11 (e.g., a reset transistor) through a metal electrode via 8 (e.g., a step via, at least a portion of which having a trapezoidal shape). A portion of the metal electrode via 8 exposes part of the reset signal line 12, another portion of the metal electrode via 8 exposes part of the second semiconductor electrode 22. The present array substrate further includes a metal electrode 73 extending throughout the metal electrode via 8. The metal electrode 73 is in contact with a first portion of the metal electrode via 8 that exposes part of the reset signal line 12, and a second portion of the metal electrode via 8 that exposes part of the second semiconductor electrode 22. Through the metal electrode 73, the reset signal line 12 is connected to the second semiconductor electrode 22, which is in then connected to two drain electrodes 72 in two neighboring pixel units in a same column within a same pixel unit group in the array substrate (i.e., the two neighboring pixel units belong to two neighboring rows within a same pixel unit group). By having this design, all vias (e.g., the source via, the drain via, and the metal electrode via) can be fabricated in a single patterning process. Thus, the present design significantly simplifies the manufacturing process and greatly lowers the manufacturing costs.

Optionally, the projection of the metal electrode via 8 in plan view of the base substrate overlaps with (and optionally within) the projection of the reset signal line 12.

Figure 5:
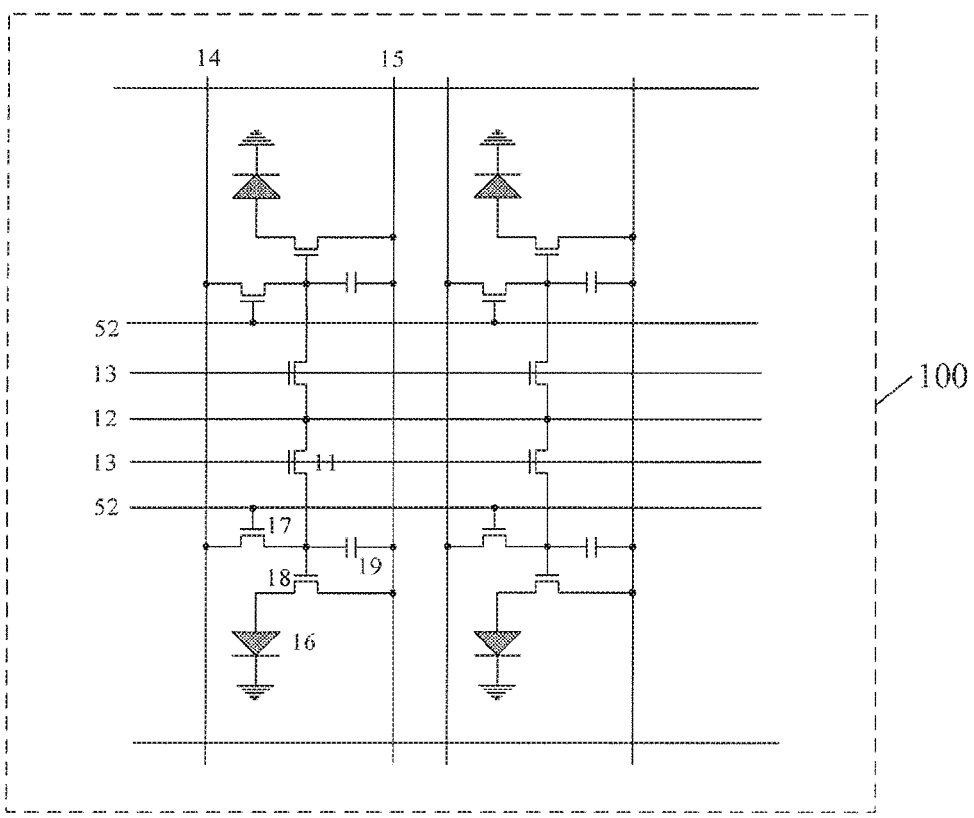
FIG. 5 is diagram illustrating the arrangement of pixel units within a pixel unit group 100 of an array substrate in some embodiments.

FIG. 5 is diagram illustrating the arrangement of pixel units within a pixel unit group 100 of an array substrate in some embodiments. Referring to FIG. 5, the array substrate in the embodiment further includes a plurality of reset scanning lines 13. Optionally, the array substrate further includes two reset scanning lines 13 between two neighboring rows of pixel units within each pixel unit group. Optionally, between two neighboring rows of pixel units within each pixel unit group, the array substrate includes a reset signal line 12 between the two reset scanning lines 13.

Optionally, the array substrate further includes a plurality of gate lines 52. Optionally, the array substrate further includes two gate lines 52 between two neighboring rows of pixel units within each pixel unit group. Optionally, between two neighboring rows of pixel units within each pixel unit group, the array substrate includes two reset scanning lines 13 between the two gate lines 52.

Optionally, the reset scanning lines 13 and the gate lines 52 are in a same layer as the gate electrodes 51.

Optionally, the array substrate further includes a plurality of data lines 14 and a plurality of power signal lines 15. Optionally, the array substrate further includes a date line 14 and a power signal line 15 between two neighboring columns of pixel units. Optionally, the data line 14 and the power signal line 15 are in a same layer as the source electrode 71 and the drain electrode 72 in the first thin film transistor 11.

Optionally, each pixel unit 10 includes a light emitting unit 16, a second thin film transistor 17, a third thin film transistor 18, and a capacitor 19. Optionally, the gate electrode 51 of a first thin film transistor 11 is electrically connected to an adjacent reset scanning line 13. Optionally, the source electrode 71 of a first thin film transistor 11 is electrically connected to the source electrode 71 of a second thin film transistor. Optionally, the gate electrode 51 of a third thin film transistor 18 is electrically connected to a first terminal of a capacitor 19. Optionally, the gate electrode 51 of a second thin film transistor 17 is electrically connected to an adjacent gate line 52. Optionally, the drain electrode 72 of a second thin film transistor 17 is electrically connected to a data line 14. Optionally, the drain electrode 72 of a third thin film transistor 18 and a second terminal of the capacitor 19 are electrically connected to a power signal line 15. Optionally, the source electrode 71 of the third thin film transistor 18 is electrically connected to a light emitting unit 16.

The present array substrate includes a reset signal line shared by two adjacent rows of pixel units that belongs to a same pixel unit group. The reset signal line is connected to the first thin film transistor (e.g., a reset transistor) through a metal electrode via (e.g., a step via, at least a portion of which having a trapezoidal shape). A portion of the metal electrode via exposes part of the reset signal line, another portion of the metal electrode via exposes part of the second semiconductor electrode. The present array substrate further includes a metal electrode extending throughout the metal electrode via. The metal electrode is in contact with a first portion of the metal electrode via that exposes part of the reset signal line, and a second portion of the metal electrode via that exposes part of the second semiconductor electrode. Through the metal electrode, the reset signal line is connected to the second semiconductor electrode, which is in turn connected to two drain electrodes in two neighboring pixel units in a same column within a same pixel unit group in the array substrate (i.e., the two neighboring pixel units belong to two neighboring rows within a same pixel unit group). By having this design, all vias (e.g., the source via, the drain via, and the metal electrode via) can be fabricated in a single patterning process. Thus, the present design significantly simplifies the manufacturing process and greatly lowers the manufacturing costs.

Figure 6:
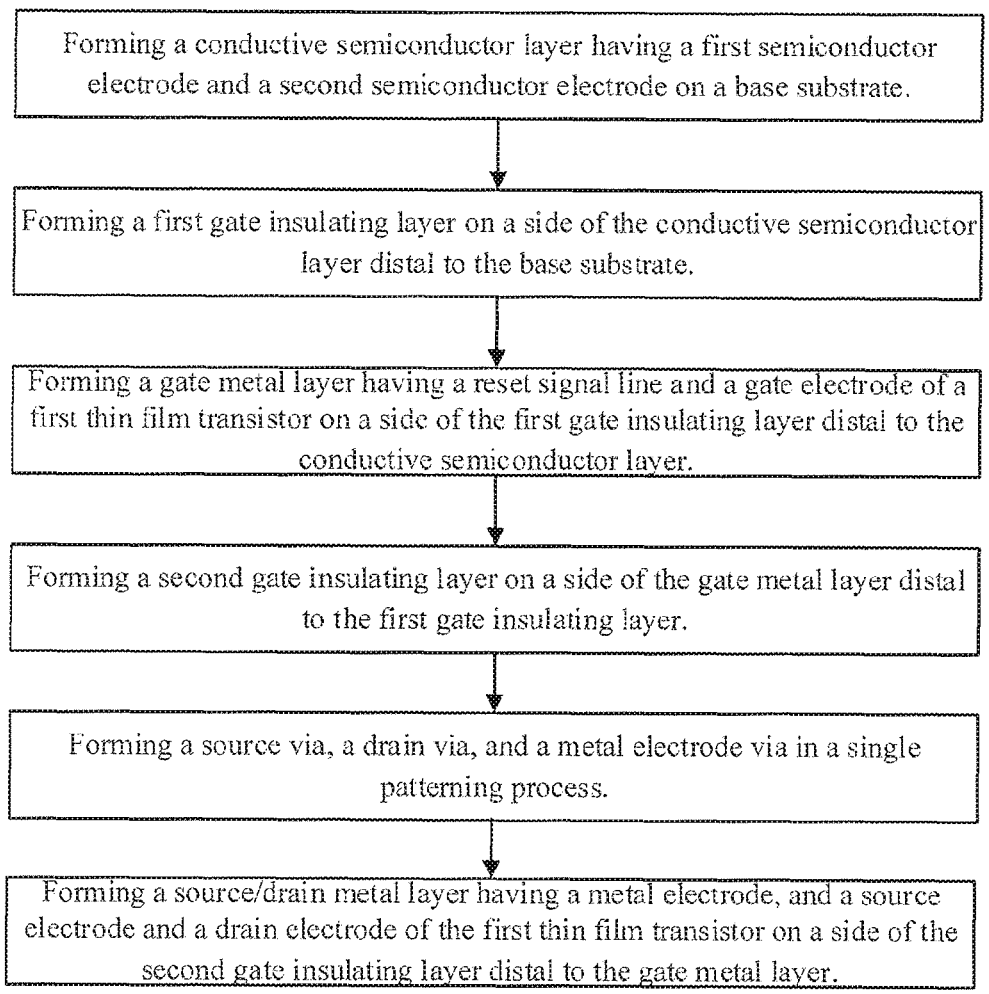
FIG. 6 is a flow chart illustrating a method of fabricating an array substrate in some embodiments.

In another aspect, the present disclosure provides a method of fabricating an array substrate. FIG. 6 is a flow chart illustrating a method of fabricating an array substrate in some embodiments. The array substrate in the embodiment includes a plurality of rows of pixel units and a plurality of columns of pixel units intersecting each other, each pixel unit is adjacent to at least one neighboring pixel unit in a same row, and is adjacent to at least one neighboring pixel unit in a same column. The plurality of pixel units are grouped into a plurality of pixel unit groups, each of which includes two adjacent rows of pixel units. Each pixel unit group further includes a reset signal line 12 between the two adjacent rows of pixel units within each pixel unit group.

Referring to FIG. 6, the method in the embodiment includes forming a conductive semiconductor layer having a first semiconductor electrode and a second semiconductor electrode on a base substrate; forming a first gate insulating layer on a side of the conductive semiconductor layer distal to the base substrate; forming a gate metal layer having a reset signal line and a gate electrode of a first thin film transistor on a side of the first gate insulating layer distal to the conductive semiconductor layer; forming a second gate insulating layer on a side of the gate metal layer distal to the first gate insulating layer; forming a source via, a drain via, and a metal electrode via in a single patterning process; forming a source/drain/metal electrode layer having a metal electrode, and a source electrode and a drain electrode of the first thin film transistor on a side of the second gate insulating layer distal to the gate metal layer. The metal electrode via is at a position corresponding to an area where the reset signal line and the second semiconductor electrode overlap in plan view of the base substrate. The source electrode of the first thin film transistor is electrically-connected to the first semiconductor electrode through the source via, the drain electrode of the first thin film transistor is electrically connected to the second semiconductor electrode through the drain via, the metal electrode is electrically connected to the reset signal line and the second semiconductor electrode through the metal electrode via. A portion of the metal electrode via exposes part of the reset signal line, another portion of the metal electrode via exposes part of the second semiconductor electrode. The reset signal line is electrically connected through the metal electrode to the second semiconductor electrode, which is in turn electrically connected to two drain electrodes in two neighboring pixel units in a same column within a same pixel unit group in the array substrate. Optionally, the metal electrode via is a step via, at least a portion of which having a trapezoidal shape.

The array substrate manufactured by the present method includes a reset signal line shared by two adjacent rows of pixel units that belongs to a same pixel unit group. The reset signal line is connected to, the first thin film transistor (e.g., a reset transistor) through a metal electrode via (e.g., a step via, at least a portion of which having a trapezoidal shape). A portion of the metal electrode via exposes part of the reset signal line, another portion of the metal electrode via exposes part of the second semiconductor electrode. The present array substrate further includes a metal electrode extending throughout the metal electrode via. The metal electrode is in contact with a first portion of the metal electrode via that exposes part of the reset signal line, and a second portion of the metal electrode via that exposes part of the second semiconductor electrode. Through the metal electrode, the reset signal line is connected to the second semiconductor electrode, which is in turn connected to two drain electrodes in two neighboring pixel units in a same column within a same pixel unit group in the array substrate (i.e., the two neighboring pixel units belong to two neighboring rows within a same pixel unit group). By having this design, all vias (e.g., the source via, the drain via, and the metal electrode via) can be fabricated in a single patterning process. Thus, the present design significantly simplifies the manufacturing process and greatly lowers the manufacturing costs.

In another aspect, the present disclosure provides a display panel having an array substrate as described herein or manufactured by a method described herein.

In another aspect, the present disclosure provides a display apparatus having a display panel described herein. Examples of display apparatuses include, but are not limited to, an electronic paper, a mobile phone, a tablet computer, a television, a notebook computer, a digital album, a GPS, etc.

In the present display panel and display apparatus, the array substrate includes a reset signal line shared by two adjacent rows of pixel units that belongs to a same pixel unit group. The reset signal line is connected to the first thin film transistor (e.g., a reset transistor) through a metal electrode via (e.g., a step via, at least a portion of which having a trapezoidal shape). A portion of the metal electrode via exposes part of the reset signal line, another portion of the metal electrode via exposes part of the second semiconductor electrode. The present array substrate further includes a metal electrode extending throughout the metal electrode via. The metal electrode is in contact with a first portion of the metal electrode via that exposes part of the reset signal line, and a second portion of the metal electrode via that exposes part of the second semiconductor electrode. Through the metal electrode, the reset signal line is connected to the second semiconductor electrode, which is in turn connected to two drain electrodes in two neighboring pixel units in a same column within a same pixel unit group in the array substrate (i.e., the two neighboring pixel units belong to two neighboring rows within a same pixel unit group). By having this design, all vias (e.g., the source via, the drain via, and the metal electrode via) can be fabricated in a single patterning process. Thus, the present design significantly simplifies the manufacturing process and greatly lowers the manufacturing costs.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be interred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
a base substrate; and a plurality of rows of pixel units and a plurality of rows of reset signal lines on the base substrate, every two adjacent rows of pixel units share one reset signal line;
wherein every two adjacent rows of pixel units and a reset signal line between the two adjacent rows of pixel units constitute a pixel unit group, each pixel unit group comprises a plurality of columns of pixel units;
each pixel unit comprises a reset thin film transistor, each reset thin film transistor comprises a conductive semiconductor layer on the base substrate, a first insulating layer on a side of the conductive semiconductor layer distal to the base substrate, a gate electrode on a side of the first insulating layer distal to the conductive semiconductor layer, a second insulating layer on a side of the gate electrode distal to the first insulating layer, a source/drain/metal electrode layer on a side of the second insulating layer distal to the gate electrode, and a source via, a drain via, and a metal electrode via; the conductive semiconductor layer comprises a first semiconductor electrode and a second semiconductor electrode, and the source/drain/metal electrode layer comprises a source electrode, a drain electrode, and a metal electrode;
the metal electrode via is at a position corresponding to an area where the reset signal line and the second semiconductor electrode overlap in plan view of the substrate, the metal electrode via exposing part of the reset signal line and part of the second semiconductor electrode;
the metal electrode within the metal electrode via is electrically connected to the reset signal line and the second semiconductor electrode, the second semiconductor electrode is electrically connected to two drain electrodes of the reset thin film transistor in two neighboring pixel units in a same column within a same pixel unit group through two corresponding drain vias; and
the source electrode is electrically connected to the first semiconductor electrode through the source via.

2. The array substrate of claim 1, wherein two adjacent pixels in a same column of a same pixel unit group share a same metal electrode through a same metal electrode via, and share a same second semiconductor electrode; the second semiconductor electrode is a continuous layer connecting two reset thin film transistors in a same column of a same pixel unit group.

3. The array substrate of claim 1, wherein the metal electrode via is a step via, at least a portion of which having a trapezoidal shape.

4. The array substrate of claim 1, wherein a projection of the metal electrode via in plan view of the base substrate is within a projection of the reset signal line.

5. The array substrate of claim 1, further comprising two reset scanning lines between the two adjacent rows of pixel units within the same pixel unit group; the reset signal line is between the two reset scanning lines.

6. The array substrate of claim 5, further comprising two gate lines between the two adjacent rows of pixel units within the same pixel unit group; the two reset scanning lines are between the two gate lines.

7. The array substrate of claim 6, wherein the two reset scanning lines and the two gate lines are in a same layer as the gate electrode.

8. The array substrate of claim 6, further comprising a plurality of data lines and a plurality of power signal lines;

each date line and each power signal line are between two adjacent columns of pixel units.

9. The array substrate of claim 8, wherein each pixel unit further comprises a light emitting unit, a second thin film transistor, a third thin film transistor, and a capacitor; wherein the gate electrode is electrically connected to an adjacent reset scanning line; the source electrode of the reset thin film transistor is electrically connected to a source electrode of the second thin film transistor, a gate electrode of the third thin film transistor is electrically connected to a first terminal of the capacitor, the gate electrode of the second thin film transistor is electrically connected to an adjacent gate line, a drain electrode of a second thin film transistor is electrically connected to a data line, a drain electrode of a third thin film transistor and a second terminal of the capacitor are electrically connected to a power signal line, and a source electrode of the third thin film transistor is electrically connected to the light emitting unit.

10. A display panel comprising the array substrate of claim 1.

11. A display apparatus comprising the display panel of claim 10.

12. A method of fabricating an array substrate, comprising:
forming a plurality of rows of pixel units and a plurality of rows of reset signal lines on a base substrate, every two adjacent rows of pixel units share one reset signal line;
wherein every two adjacent rows of pixel units and a reset signal line between the two adjacent rows of pixel units constitute a pixel unit group, each pixel unit group comprises a plurality of columns of pixel units;
the step of forming the plurality of rows of pixel units and the plurality of rows of reset signal lines comprises forming a rest thin film transistor within each pixel unit; the step of forming the reset thin film transistor comprises:
forming a conductive semiconductor layer having a first semiconductor electrode and a second semiconductor electrode on the base substrate;
forming a first gate insulating layer on a side of the conductive semiconductor layer distal to the base substrate;
forming a gate metal layer having a reset signal line and a gate electrode of a first thin film transistor on a side of the first gate insulating layer distal to the conductive semiconductor layer;
forming a second gate insulating layer on a side of the gate metal layer distal to the first gate insulating layer;
forming a source via, a drain via, and a metal electrode via in a single patterning process; and
forming a source/drain metal layer having a metal electrode, and a source electrode and a drain electrode of the first thin film transistor on a side of the second gate insulating layer distal to the gate metal layer;
the metal electrode via is at a position corresponding to an area where the reset signal line and the second semiconductor electrode overlap in plan view of the base substrate, the metal electrode via exposing part of the reset signal line and part of the second semiconductor electrode;
the metal electrode within the metal electrode via is electrically connected to the reset signal line and the second semiconductor electrode, the second semiconductor electrode is electrically connected to two drain electrodes of the reset thin film transistor in two neighboring pixel units in a same column within a same pixel unit group through two corresponding drain vias; and
the source electrode is electrically connected to the first semiconductor electrode through the source via.

13. The method of claim 12, wherein two adjacent pixels in a same column of a same pixel unit group share a same metal electrode through a same metal electrode via, and share a same second semiconductor electrode; the second semiconductor electrode is a continuous layer connecting two reset thin film transistors in a same column of a same pixel unit group.

14. The method of claim 12, wherein the metal electrode via is a step via, at least a portion of which having a trapezoidal shape.

15. The method of claim 12, wherein a projection of the metal electrode via in plan view of the base substrate is within a projection of the reset signal line.

16. The method of claim 12, further comprising forming two reset scanning lines between the two adjacent rows of pixel units within the same pixel unit group; wherein the reset signal line is formed between the two reset scanning lines.

17. The method of claim 16, further comprising forming two gate lines between the two adjacent rows of pixel units within the same pixel unit group; wherein the two reset scanning lines are formed between the two gate lines.

18. The method of claim 17, wherein the two reset scanning lines and the two gate lines are formed in a single process and in a same layer as the gate electrode.

19. The method of claim 17, further comprising forming a plurality of data lines and a plurality of power signal lines; each date line and each power signal line are formed between two adjacent columns of pixel units.

20. The method of claim 19, further comprising: forming a light emitting unit, a second thin film transistor, a third thin film transistor, and a capacitor in each pixel unit;
wherein the gate electrode is electrically connected to an adjacent reset scanning line; the source electrode of the reset thin film transistor is electrically connected to a source electrode of the second thin film transistor, a gate electrode of the third thin film transistor is electrically connected to a first terminal of the capacitor, the gate electrode of the second thin film transistor is electrically connected to an adjacent gate line, a drain electrode of a second thin film transistor is electrically connected to a data line, a drain electrode of a third thin film transistor and a second terminal of the capacitor are electrically connected to a power signal line, and a source electrode of the third thin film transistor is electrically connected to the light emitting unit.

* * * * *